United States Patent [19]

Boenning

[11] Patent Number: 4,935,699
[45] Date of Patent: Jun. 19, 1990

[54] MEANS TO DETECT AND LOCATE PINCHING AND CHAFING OF CONDUITS

[75] Inventor: Robert A. Boenning, Timonium, Md.
[73] Assignee: Westinghouse Electric Corp., Pittsburgh, Pa.
[21] Appl. No.: 351,496
[22] Filed: May 15, 1989
[51] Int. Cl.⁵ .......................................... G01R 31/08
[52] U.S. Cl. ................................. 324/555; 340/665
[58] Field of Search ............. 338/32 R; 340/665, 666; 324/555

[56] References Cited

U.S. PATENT DOCUMENTS

| | | | |
|---|---|---|---|
| 3,750,127 | 7/1973 | Ayers et al. | 340/665 |
| 3,794,790 | 2/1974 | Leyland | 200/86 R |
| 4,524,256 | 6/1985 | Miyata et al. | 200/86 R |
| 4,617,433 | 10/1986 | Hoshikawa et al. | 200/86 R |
| 4,629,925 | 12/1986 | Booth et al. | 310/330 |

Primary Examiner—Reinhard J. Eisenzopf
Assistant Examiner—Maura Regan
Attorney, Agent, or Firm—J. K. Williamson

[57] ABSTRACT

A conduit has a core and an axial length susceptible to being pinched and chafed by other structure adjacent the conduit. An inner semiconductive layer extends the length of the conduit susceptible to being pinched and has a reference point adapted to be electrically connected with a detecting circuit for detecting a pinch and/or a computing unit for determining the location of a pinch. A resiliently compressible electrical switching layer, which is nonconducting when not pinched and conducting when pinched, is superposed against the inner semiconductive layer.

11 Claims, 3 Drawing Sheets

MEANS TO DETECT AND LOCATE PINCHING AND CHAFING OF CONDUITS

BACKGROUND

This invention generally relates to conduits susceptible to being pinched or chafed by other structure in an assembly and to assemblies comprising such conduits and means for detecting and locating a pinch or a chafe.

This invention is generally useful with conduits which non-rigidly extend from components of an assembly such as cables, tubing, hoses and the like. Such conduits are employed for containing one or more electrical cables, optical fibers or various types of fluid lines in their cores, for example. They may also be employed as hydraulic and pneumatic hoses and tension cables. This invention is particularly useful in blind installations where electrical cables, for example, are hidden from view and in installations where cables are not readily accessible and, therefore, it is impossible to determine visually whether or not the cable has been pinched or chafed.

A frequent mode of failure of non-fixed conduits occurs during equipment assembly and later in removal and reassembly when, e.g., a conduit may be inadvertently pinched between a housing and a structural member. Such pinching may lead to an immediate failure or a later failure. Also, a relatively insignificant pinching condition may eventually lead to a progressive failure due to chafing caused, e.g., by vibrations which abrade the conduit. Such failures are of particular concern in aircraft and similar applications where human life is involved and it is not practical to repeatedly check locations of potential failures. In addition, it can be very time-consuming to locate an actual fault or other defective condition known to exist.

In addition to normal operational failures, there is also a concern regarding attempted sabotage of communication lines, computer cables and other relatively accessible vital conduits, which attempt may not be detected. Whether or not detected however, the location of one or more pinches in long and/or many conduits must be determined quickly and the location(s) inspected as soon as possible.

It has been heretofore impractical to locate pinching conditions. Devices such as electric switches of the type used in vehicle monitoring applications, as disclosed by U.S. Pat. No. 3,794,790, cannot locate faults. Apparatus such as is disclosed in copending U.S. application Ser. No. 351498 filed 5/15/89, entitled "Apparatus for Detecting Excessive Chafing of a Cable Arrangement Against an Electrically Grounded Structure", which is assigned to the assignee of the present invention, are not useful unless there has been abrasive chafing.

SUMMARY OF THE INVENTION

Thus it is an object of this invention to provide an assembly comprising a conduit having a structure which enables the location of a potential or actual fault such as a pinched condition to be readily detected or determined. A pinched condition can be easily located without requiring an assembly to be torn down and the lengths of numerous conduits examined for faults which frequently will not be evident without close examination.

A conduit embodying the present invention generally has a core and an axial length which is susceptible to being pinched. In the general case, a conduit is employed in an assembly and will be pinched by electrically ground structure. An inner semiconductive layer extends the length of the conduit and substantially surrounds the core. The inner semiconductive layer is adapted to be electrically connected with means for detecting and/or determining the location of a pinch. Preferably the inner semiconductive layer surrounds the conduit core. A piezoresistive material is advantageously employed between the inner semiconductive layer and the electrically grounded structure. A piezoresistive material is a material which changes from a non-conductive to a conductive material when mechanically strained or vice versa. Piezoresistive materials are employed as electrical switches. A resiliently compressible piezoresistive electrical switching layer, which is electrically conductive in the pinched condition, is superposed against the inner semiconductive layer and surrounds the conduit core. Conduits designed to be used in situations where, e.g., a moving object may strike a suspended section of a conduit and, therefore, the pinch is not caused by electrically grounded structure, or in instances where the structure is composed of electrically non-conductive material, may have an outer electrical conducting element such as a metallic conductor or a semiconductive layer superposed against the switching layer. The conduit is then adapted for pinching contact with a non-grounded object and electrical contact with grounded structure.

Conduits employing the present invention advantageously combine the characterizing electrical features of semiconductive layers and resiliently compressible switching layers to generate an analog electrical signal which correlates with the location of a pinch. Preferably, the semiconductive materials have electrical resistivities of at least about $10^{-4}$ to $10^{-2}$ ohms/cm$^3$, which is about $10^2$ to $10^4$ times the resistivities of metals such as copper which have been heretofore employed with prior art electrical switches. Thus even the shortest of commercially useful conduits have sufficiently large resistances relative to resiliently compressed electrical switches, which render the switch resistances negligible and facilitates the use of presently available instrumentation. When the electrical switching layer is sufficiently compressed (i.e. the cable is pinched) at a distance from the inner semiconductive layer reference point, the inner semiconductive layer is grounded at that location which generates a substantial change in the voltage at the reference point proportional to the distance. A signal in analog or digitized form may then be fed to a detecting circuit and/or a computing unit for computing the location of the pinch.

Other details, objects and advantages of the invention will become apparent as the following description of presently preferred embodiments thereof proceeds.

DESCRIPTION OF THE DRAWINGS

The accompanying drawings generally illustrate the embodiments of the invention described below. More specifically.

DESCRIPTION OF PREFERRED EMBODIMENTS

Figure 1:
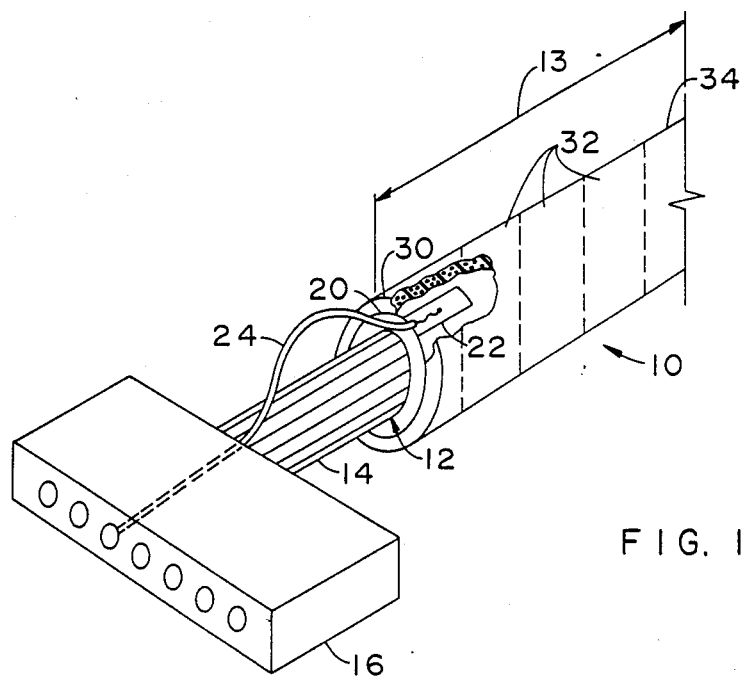
FIG. 1 is a schematic partially fragmentary perspective of a conduit generally embodying the present invention.

FIG. 1 generally shows a portion of a flexible conduit 10 embodying the present invention which generally has core 12 and an axial length 13 for carrying electrical lines 14 which may extend to a pin connector 16 as shown or to other components of an assembly such as, e.g., a computer, in which the conduit may be pinched by adjacent components, structural members of the assembly, access doors and the like (not shown). The conduit 10 may alternatively be employed to carry optic fibers, instrument air lines, tension cables (for elevator, cranes etc.) and the like in the core 12. Similar conduits may be employed to carry gases or hydraulic fluids in industrial applications, oxygen in medical applications, and other fluids in critical applications.

The conduit 10 has an inner semiconductive layer 20 disposed along its length. The inner semiconductive layer 20 has a reference point 22 connected by a lead 24 to the pin connector 16. The reference point 22 is ultimately connected with a pinching detecting circuit 26 and a computing unit 28 shown in FIG. 3. Preferably the inner semiconductive layer 20 surrounds the core 12. The inner semiconductive layer 20 may be an elastomer such as rubber, polyvinyl chloride, or other suitable elastomer or polymer which may be filled with dispersed electrically conducting particles of carbon or other suitable conductor. The inner semiconductive layer 20 may be a tape which is wound around the lines 14 to form a spiral or a sleeve surrounding core 12 or may be tubular.

Figure 2:
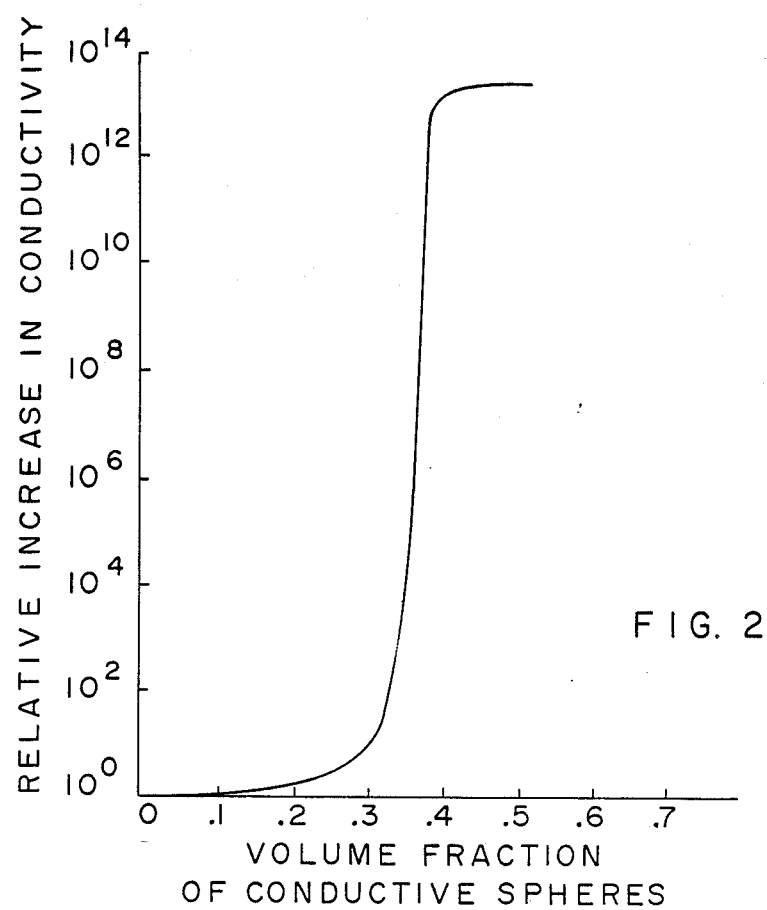
FIG. 2 is a graphical representation of the characterizing feature of a piezoresistive electrical switching layer which may be employed with the elongate body of FIG. 1.

The conduit 10 also has a resiliently compressible piezoresistive electrical switch superposed against the inner semiconductive layer 20, such as layer 30 which preferably surrounds the core as well. The metallic component of switching layer 30 may be silver, nickel or other suitable conducting metal or alloy. FIG. 2 shows the characterizing conductivity change of a typical piezoresistive resiliently compressible composite switching layer comprising a dispersion of colloidal metal spheres in a silicone elastomer. FIG. 2 shows that there is an almost step change in conductivity of about twelve orders of magnitude upon about a 5% change in volume for a composite containing about 30% by volume of metal spheres.

In a preferred embodiment of the invention, the resiliently compressible elastomer contains a dispersion of colloidal nickel spheres having diameters of from about 1 to 10 microns. The elastomer and metallic components and their volumetric fractions are selected so that a reasonably compressible composite has a normal conductivity just below the knee of the conductivity curve in its expanded condition and a conductivity of at least about five orders of magnitude greater in its compressed condition. Also the resistance of the compressible composite in its compressed state should be relatively insignificant compared to the resistance of the inner semiconductive layer 20.

Figure 3:
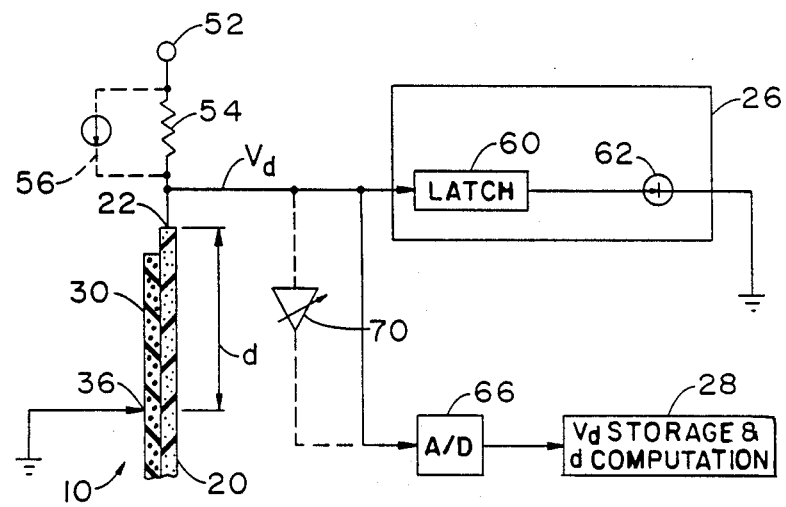
FIG. 3 is a schematic representation of an embodiment of the invention of FIG. 1 in combination with a pinch detecting circuit and a computing unit.
Figure 4:
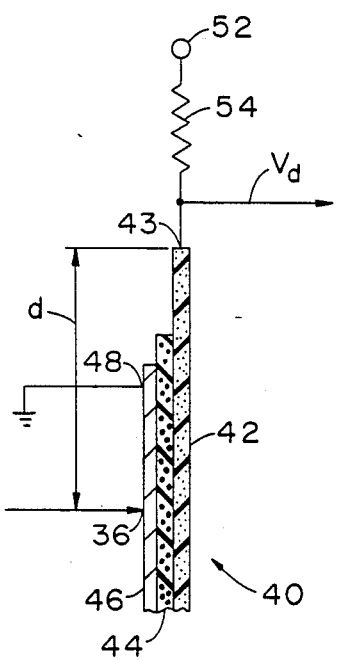
FIG. 4 is a schematic representation of an alternative embodiment of the invention, which is useful in situations where the pinching structure is not electrically conductive.

FIG. 3 generally shows a conduit 10 which may be pinched at a location 36 by grounded structure. The location 36 is at a distance "d" from the reference point 22 of the inner semiconductive layer 20. FIG. 4 generally shows a similar conduit 40 having an inner semiconductive layer 42 with reference point 43 and a superposed resiliently compressible electrical switching layer 44, which has an outer conducting layer 46 which is grounded at point 48. The outer conducting layer 46 is preferably a metallic electrical conductor such as an aluminum expandable braid. Aluminum expandable braids may be advantageously employed to conserve weight in aircraft applications or elsewhere. Metal sheathing may be advantageously employed to shield the conduit core from electromagnetic interference and to protect the conduit 40 from chafing. The outer electrical element may also be a semiconductive layer of the type employed as an inner semiconductive layer. Thus the outer conducting element 46 may be an axial sleeve or a spiral wrap along the length of the resiliently compressible layer 30.

FIG. 3 also schematically shows conduit 10 electrically connected to a pinching detecting circuit 26 and a computing unit 28 for determining the location 36 of a pinch. As shown in FIG. 3, the reference point 22 of the inner semiconductive layer 22 is connected to a power source 52 through a series resistor 54 (or optionally a current source 56). When there is no pinching or chafing, a voltage $V_o$ is output to the detecting circuit 26, which corresponds to a logic state of "1". When there is a pinch by the grounded structure occurring at, e.g., a location 36, a substantial increase in conductivity through the resiliently compressible electrical switching layer 30 effectively grounds the inner semiconductive layer 20 and outputs a lower voltage $V_d$ equal to:

$$V_{source} \left[ \frac{[(Ro)(d)]}{[(Rs) + (Ro)(d)]} \right]$$

where "Ro" is the resistance per unit length of the inner semiconductive layer 20 and "Rs" is the resistance of the series resistor 54, which corresponds to a logic level of "0". This condition then sets a latch 60 in the pinch detecting circuit 26 and activates an indicator such as a light emitting diode 62. The voltage $V_d$ may be converted to a digital signal by A/D converter 66 which is fed to a computing unit 28 which may be a microprocessor. The above-mentioned U.S. patent application, Ser. No. 351498 filed 5/15/89, is hereby incorporated by reference for its disclosure of pinch detecting circuits and pinch location computing units which may be employed with conduits embodying the present invention.

The reference end 22 of inner semiconductor 20 may be connected to a constant current source 56 instead of to the series resistor 54 and a scale amplifier 70 may be employed to enable a technician to directly read out the pinch location 36.

Conduits embodying the present invention are also useful in aircraft and similar assemblies where vibrations and/or very high frequently applied forces may cause the structures to chafe and eventually abrade portions of resiliently compressible electrical switching layers 30 held against electrically grounded structures without effectively pinching the conduits 10. In these assemblies, the abrasion of a resiliently compressible layer 30 will result in electrical contact either through the compressible layer or through direct contact with the inner semiconductive layer, either of which will trigger the pinching detector circuit 26 and the computing unit 28.

While certain preferred embodiments of the present invention have been described and shown, it is to be distinctly understood that the invention is not limited thereto, but may be otherwise variously embodied within the scope of the following claims.

What is claimed is:

1. A conduit generally having a core and an axial length, which length is susceptible to being pinched, comprising:
   an inner semiconductive layer extending the length of the conduit substantially surrounding the core, the inner semiconductive layer adapted to be electrically connected with a detecting means for detecting the location of a pinch or chafe; and
   a resiliently compressible piezoresistive electrical switching layer which is non-conducting when not pinched and conducting when pinched, the electrical switching layer superposed against the inner semiconductive layer and around the core.

2. A conduit generally having a core and an axial length, which length is susceptible to being pinched or chafed, comprising:
   an inner semiconductive layer extending the length of the conduit substantially surrounding the core, the inner semiconductive layer having a reference point adapted to be electrically connected with a computing unit for determining the location of a pinch or chafe; and
   a resiliently compressible piezoresistive electrical switching layer which is non-conducting when not not pinched and conducting when pinched, the electrical switching layer superposed against the inner semiconductive layer and around the core.

3. The conduit of claim 2, wherein the inner semiconductive layer surrounds the core of the conduit.

4. The conduit of claim 3, wherein the inner semiconductive layer is comprised of an elastomer filled with dispersed conductive particles, the semiconductive layer having a resistivity of at least about $10^{-4}$ to $10^{-2}$ ohms/cm$^3$.

5. The conduit of claim 2, wherein the electrical switching layer comprises a composite of conductive particles uniformly dispersed in an elastomer.

6. The conduit of claim 5, wherein the electrical switching layer comprises an elastomer containing about 30% (by total volume) of dispersed metallic spheres having diameters of from 1 to 10 microns.

7. The conduit of claim 2, wherein an outer electrically conducting element is superposed against the electrical switching layer, the outer conducting element adapted to be in electrical contact with a voltage potential different from the voltage potential of the reference point of the inner semiconductive layer.

8. The conduit of claim 7, wherein the outer conducting element comprises a layer superposed against the electrical switching layer.

9. In an assembly having at least one conduit extending from a component thereof, said at least one conduit operatively connected with a detecting means for detecting a pinch or chafe of the conduit, the conduit having:
   a core and an axial length;
   an inner semiconductive layer substantially surrounding the core and operatively connected with the detecting means; and
   a resiliently compressible piezoresistive electrical switching layer, which is non-conducting when not pinched and conducting when pinched, superposed against the inner semiconductive layer and around the core.

10. In an assembly having at least one conduit extending from a component thereof, said at least one conduit operatively connected with a computing unit for determining the location of a chafe or pinch of the conduit, the conduit having:
    a core and an axial length;
    an inner semiconductive layer substantially surrounding the core and a reference point operatively connected with the computing unit; and
    a resiliently compressible piezoresistive electrical switching layer, which is non-conducting when not pinched and conducting when pinched, superposed against the inner semiconductive layer and around the core.

11. In the assembly of claim 10, a detecting means operatively connected with the inner semiconductive layer for detecting the the occurrence of a pinch or chafe of the conduit.

* * * * *